(12) United States Patent
Okazaki (10) Patent No.: US 10,777,758 B2
(45) Date of Patent: Sep. 15, 2020

(54) DISPLAY DEVICE

(71) Applicant: Sharp Kabushiki Kaisha, Sakai, Osaka (JP)

(72) Inventor: Shoji Okazaki, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/476,881

(22) PCT Filed: Jan. 27, 2017

(86) PCT No.: PCT/JP2017/002878
§ 371 (c)(1),
(2) Date: Jul. 10, 2019

(87) PCT Pub. No.: WO2018/138861
PCT Pub. Date: Aug. 2, 2018

(65) Prior Publication Data
US 2019/0334104 A1 Oct. 31, 2019

(51) Int. Cl.
*H01L 51/00* (2006.01)
*H01L 27/32* (2006.01)

(52) U.S. Cl.
CPC ...... *H01L 51/0097* (2013.01); *H01L 27/3276* (2013.01); *H01L 2251/5338* (2013.01)

(58) Field of Classification Search
None
See application file for complete search history.

(56) References Cited

U.S. PATENT DOCUMENTS

| | | | |
|---|---|---|---|
| 10,571,962 B2* | 2/2020 | Araki | H04M 1/02 |
| 10,608,071 B2* | 3/2020 | Hong | H01L 27/3258 |
| 2010/0182530 A1* | 7/2010 | Fujikawa | G02F 1/1339 349/58 |
| 2011/0050657 A1* | 3/2011 | Yamada | H01L 51/5237 345/204 |
| 2011/0068346 A1* | 3/2011 | Lee | H01L 27/3276 257/72 |
| 2014/0226275 A1 | 8/2014 | Ko et al. | |
| 2014/0319550 A1 | 10/2014 | Yamazaki et al. | |
| 2015/0293546 A1 | 10/2015 | Tanaka et al. | |
| 2017/0069867 A1* | 3/2017 | Hirakata | H01L 51/52 |
| 2018/0138442 A1* | 5/2018 | Kim | G06F 3/041 |
| 2018/0203547 A1* | 7/2018 | Akimoto | H01L 29/78696 |
| 2018/0307270 A1* | 10/2018 | Pantel | H04M 1/0266 |
| 2019/0296097 A1* | 9/2019 | Hong | H01L 27/3216 |

FOREIGN PATENT DOCUMENTS

| | | |
|---|---|---|
| JP | 2009-216810 A | 9/2009 |
| JP | 2011-118082 A | 6/2011 |
| JP | 2014-161009 A | 9/2014 |
| JP | 2014-225010 A | 12/2014 |
| WO | 2014/069529 A1 | 5/2014 |

OTHER PUBLICATIONS

Official Communication issued in International Patent Application No. PCT/JP2017/002878, dated Apr. 11, 2017.

* cited by examiner

*Primary Examiner* — J. E. Schoenholtz
(74) *Attorney, Agent, or Firm* — Keating & Bennett, LLP (57) ABSTRACT

A display device includes one flexible display panel (2) having at least one part at which the one flexible display panel (2) is folded, at least one of end parts (21) of the at least one part is formed so as to have a concave shape.

18 Claims, 8 Drawing Sheets

DISPLAY DEVICE

TECHNICAL FIELD

The disclosure relates to a display device including a flexible display (flexible display panel) having at least one part at which the flexible display is folded.

BACKGROUND ART

In recent years, great attention has been drawn to flexible displays (flexible display panels) such as flexible liquid crystal display panels and flexible organic electroluminescence display panels (flexible organic EL display panels). This is because the flexible displays can be rolled, folded, stored or carried, and worn like clothe.

Figure 11:
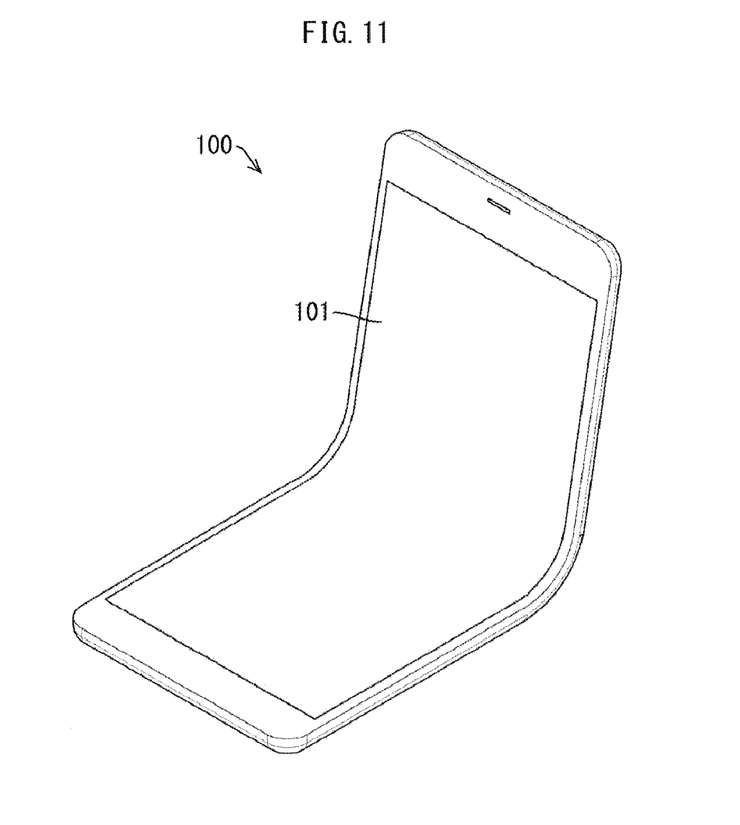
FIG. 11 is a view schematically illustrating a configuration of a conventional flexible mobile device disclosed in Patent Literature 1.

FIG. 11 is a view schematically illustrating a configuration of a conventional flexible mobile device 100 disclosed in Patent Literature 1.

In the flexible mobile device 100, a flexible display panel 101 is used. This allows the flexible mobile device 100, which includes the flexible display panel 101, to be folded or expanded.

CITATION LIST

Patent Literature

[Patent Literature 1]
Japanese Patent Application Publication, Tokukai, No. 2014-161009 (Publication Date: Sep. 4, 2014)

SUMMARY

Technical Problem

However, according to the flexible display panel 101 of the flexible mobile device 100 disclosed in Patent Literature 1, stress tends to be concentrated on both end parts of a part at which the flexible display panel 101 is folded. This poses a problem in durability of the flexible display device 101.

The disclosure has been made in view of the mentioned problem, and it is an object of an aspect the disclosure is to provide a flexible display device which is highly durable to withstand even folding at one or more positions.

Solution to Problem

In order to attain the object, a display device in accordance with an embodiment of the disclosure is a display device including: a flexible display having at least one part at which the flexible display is folded, at least one of end parts of the at least one part of the flexible display is formed so as to have a concave shape.

According to the configuration, at least one of end parts of the folding part of the flexible display is formed so as to have a concave shape. It is therefore possible to prevent stress from being concentrated on the end parts of the folding part. This achieves a display device which is highly durable to withstand even folding at one or more positions.

Advantageous Effects of Invention

According to an aspect of the disclosure, it is possible to provide a display device which is highly durable to withstand even folding at one or more positions.

BRIEF DESCRIPTION OF DRAWINGS

(a) of FIG. 9 is a view illustrating a flexible display panel constituted by a surface in which end parts of a folding part are formed so as to each have a concave shape. (b) of FIG. 9 is a view illustrating a foldable support member.

DESCRIPTION OF EMBODIMENTS

The following description will discuss an embodiment of the present invention with reference to FIGS. 1 through 10. For convenience, members having functions identical to those of described in a certain embodiment are given identical reference signs, and their descriptions may be omitted.

Embodiment 1

Embodiment 1 of the disclosure will be described below with reference to FIGS. 1 through 8.

Figure 1:
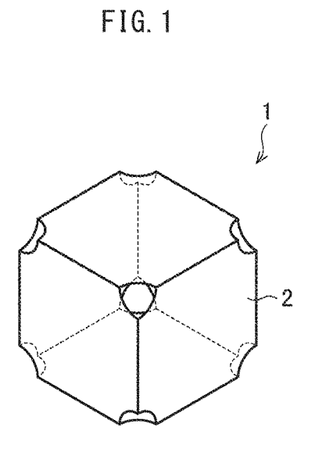
FIG. 1 is a view illustrating a hexahedron display device having six display surfaces.

FIG. 1 is a view illustrating a truncated hexahedron display device 1 which has six display surfaces and which is configured by cutting off vertices of a hexahedron.

Figure 2:
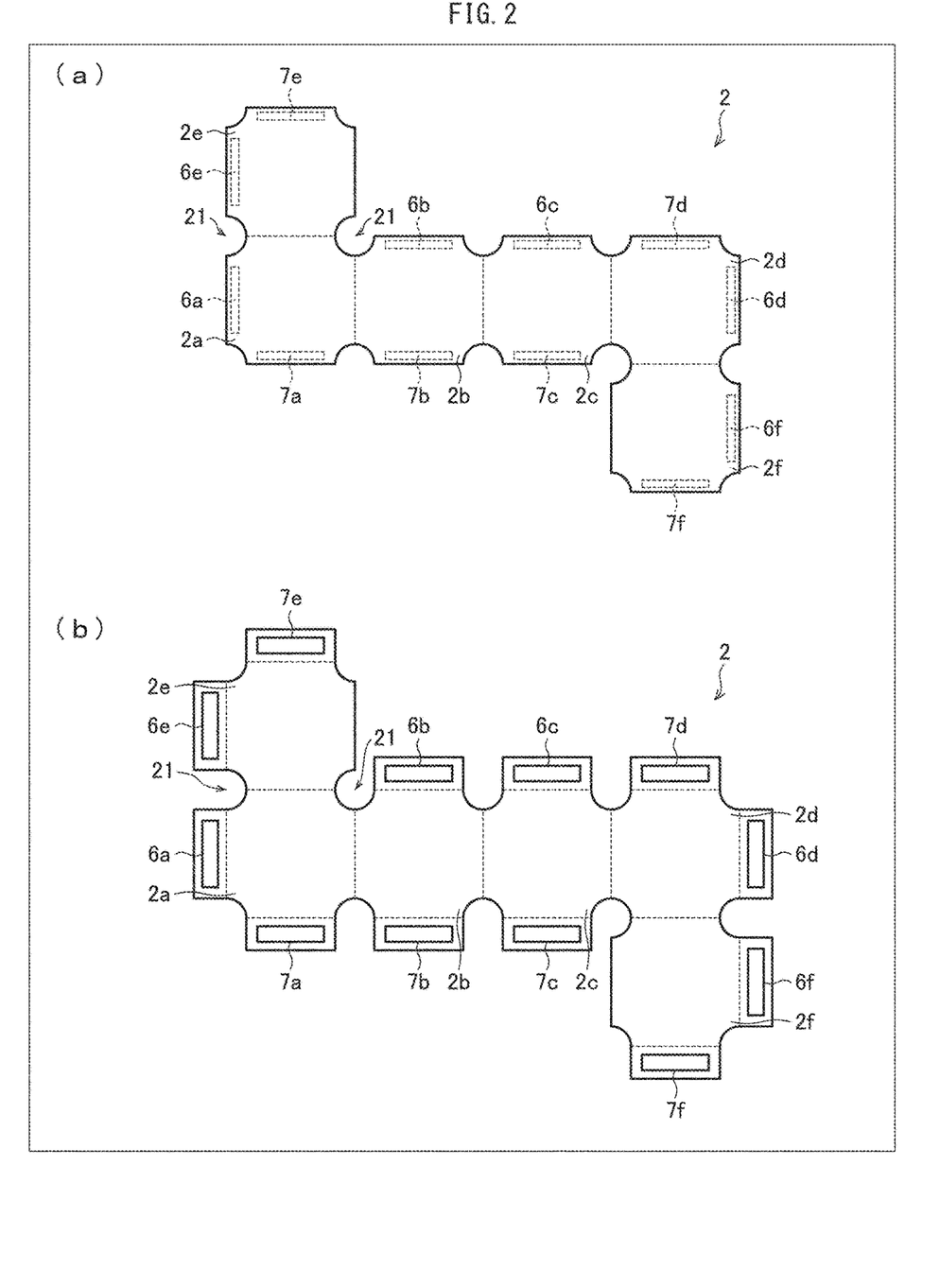
FIG. 2 is a view illustrating a flexible display panel constituting display surfaces of the hexahedron display device illustrated in FIG. 1.

FIG. 2 is a view illustrating a flexible display panel 2 constituting the display surfaces of the truncated hexahedron display device 1 illustrated in FIG. 1.

(a) of FIG. 2 is a view illustrating the flexible display panel 2 in a case where terminal parts 6a, 6b, 6c, 6d, 6e, and 6f and terminal parts 7a, 7b, 7c, 7d, 7e, and 7f are (i) provided on flexible wiring boards (Flexible Printed Circuit Board (FPCB)) connected to the flexible display panel 2 and (ii) provided on a side, which side is opposite the display surfaces. (b) of FIG. 2 illustrates a case where flexible wiring board (FPCB) parts illustrated in (a) of FIG. 2 are expanded.

As illustrated in FIGS. 1 and 2, all of the six display surfaces of the truncated hexahedron display device 1 are formed by one flexible display panel (flexible display) 2.

Embodiment 1 discusses an example in which one flexible display panel 2 is a flexible organic EL panel. However, the disclosure is not limited to this example. Alternatively, for example, one flexible display panel 2 can be a reflective flexible liquid crystal display panel or the like. A flexible organic EL panel is a display panel configured so that (i) organic EL elements are formed on a flexible substrate and (ii) a flexible film is formed on the organic EL elements and on the flexible substrate as necessary.

As illustrated in (a) and (b) of FIG. 2, the six display surfaces of the truncated hexahedron display device 1 correspond to surfaces 2a, 2b, 2c, 2d, 2e, and 2f, respectively, of different regions of the one flexible display panel 2.

As illustrated in FIGS. 1 and 2, the flexible display panel 2 is folded along dotted lines so as to form right angles between (i) the surface 2a of the flexible display panel 2 and (ii) the other surfaces 2b and 2e of the flexible display panel 2 which are connected to the surface 2a. Likewise, the flexible display panel 2 is folded along dotted lines illustrated in FIGS. 1 and 2 so as to form right angles between (i) the surface 2b of the flexible display panel 2 and (ii) the other surfaces 2a and 2c of the flexible display panel 2 which are connected to the surface 2b. Likewise, the flexible display panel 2 is folded along dotted lines illustrated in FIGS. 1 and 2 so as to form right angles between (i) the surface 2c of the flexible display panel 2 and (ii) the other surfaces 2b and 2d of the flexible display panel 2 which are connected to the surface 2c. Likewise, the flexible display panel 2 is folded along dotted lines illustrated in FIGS. 1 and 2 so as to form right angles between (i) the surface 2d of the flexible display panel 2 and (ii) the other surfaces 2c and 2f of the flexible display panel 2 which are connected to the surface 2d. Likewise, the flexible display panel 2 is folded along dotted lines illustrated in FIGS. 1 and 2 so as to form right angles between (i) the surface 2e of the flexible display panel 2 and (ii) the surface 2a which are connected to the surface 2e. Likewise, the flexible display panel 2 is folded along dotted lines illustrated in FIGS. 1 and 2 so as to form right angles between (i) the surface 2f of the flexible display panel 2 and (ii) the surface 2d which are connected to the surface 2f.

The flexible display panel 2 is folded so that the display surfaces for displaying images face the outside.

End parts 21 of a boundary part between the surface 2e and the surface 2a connected to the surface 2e are formed so as to each have a concave shape. Likewise, end parts 21 of a boundary part between the surface 2a and the surface 2b connected to the surface 2a are formed so as to each have a concave shape. Likewise, end parts 21 of a boundary part between the surface 2b and the surface 2c connected to the surface 2b are formed so as to each have a concave shape. Likewise, end parts 21 of a boundary part between the surface 2c and the surface 2d connected to the surface 2c are formed so as to each have a concave shape. Likewise, end parts 21 of a boundary part between the surface 2d and the surface 2f connected to the surface 2d are formed so as to each have a concave shape.

As illustrated in (a) and (b) of FIG. 2, at least the end parts 21 of the folding parts extending along the dotted lines (i.e., the end parts 21 of the boundary parts) are formed so as to each have a concave shape. In Embodiment 1, end parts other than folding parts are also formed so as to each have a concave shape in view of design. However, the end parts other than folding parts do not necessarily need to be formed so as to each have a concave shape.

In Embodiment 1, the flexible display panel 2 is a flexible organic EL panel configured so that (i) TFT elements and the organic EL elements are formed on a flexible substrate and (ii) a flexible film is provided on the TFT elements, the organic EL elements, and the flexible substrate. Therefore, in order for the end parts 21 of the folding parts (the end parts 21 of the boundary parts) to be formed so as to each have a concave shape, the flexible substrate and the flexible film are bored such that holes penetrate vertically through the following regions of the flexible substrate and the flexible film: regions in which (i) none of the TFT elements, the organic EL elements, and the terminal parts are formed and (ii) the flexible substrate and the flexible film overlap in a plan view.

In addition, Embodiment 1 discusses an example in which the end parts 21 of the folding parts (at which the flexible display panel 2 is to be folded to form right angles) are both bored. However, the disclosure is not limited to this example. Alternatively, it is possible that only one of the end parts 21 of a folding part (at which the flexible display panel 2 is folded to form a right angle) is bored.

Embodiment 1 discusses an example in which the end parts 21 of a boundary part (i.e., end parts of a folding part at which the flexible display panel 2 is folded to form a right angle) is bored in a circular shape. However, the disclosure is not limited to this example. Alternatively, the end parts 21 can be bored along a straight line.

Embodiment 1 discusses, as an example, the truncated hexahedron display device 1 configured by (i) folding the flexible display panel 2 along the dotted lines illustrated in FIG. 2 to have a folded shape in which side surfaces form right angles therebetween and (ii) causing the side surfaces to adhere to each other with use of an adhesive so as to fix the folded shape in the hexahedron illustrated in FIG. 1. However, the disclosure is not limited to this example. Alternatively, without the use of an adhesive, the folded shape can be temporarily fixed with use of, for example, an adhesive tape, a magnet, a screw, or the like. In a case where the folded shape is thus temporarily fixed, it is possible to change, as necessary, the shape of the truncated hexahedron display device 1.

Note that the adhesive tape, the magnet, the screw, and the like are examples of a connecting member which allows for any of a fixed state and a non-fixed state. An adhesive is an example of a connecting member which maintains only a fixed state.

As illustrated in (a) and (b) of FIG. 2, the surfaces 2a, 2b, 2c, 2d, 2e, and 2f of the different regions of the one flexible display panel 2, which correspond to the six display surfaces of the truncated hexahedron display device 1, each include two terminal parts. The terminal parts 6a, 6b, 6c, 6d, 6e, and 6f and the terminal parts 7a, 7b, 7c, 7d, 7e, and 7f are (i) provided on the respective flexible wiring board (FPCB) parts connected to the flexible display panel 2 and (ii) provided on the side opposite the display surfaces. Note that a gate driver (gate driving circuit) and a source driver (source driving circuit), which are not illustrated, are also provided for each surface. The gate driver and the source driver can be provided externally. As described later, it is possible to provide gate drivers monolithically (gate driver monolithic (GDM)) in the flexible display panel 2.

Note that for each of the surfaces 2a and 2e of the different regions of one flexible display panel 2, the respective flexible wiring boards on which the terminal parts 6a and 6e are provided are provided, through the left side of FIG. 2, to the side opposite the display surface of the flexible display panel 2. For each of the surfaces 2b and 2c of the different regions of one flexible display panel 2, the respective flexible wiring boards on which the terminal parts 6b and 6c are provided are provided, through the upper side of FIG. 2, to the side opposite the display surface of the flexible display panel 2. For each of the surfaces 2d and 2f of the different regions of one flexible display panel 2, the respective flexible wiring boards on which the terminal parts 6d and 6f are provided are provided, through the right side of FIG. 2, to the side opposite the display surface of the flexible display panel 2.

For each of the surfaces 2a, 2b, 2c, and 2f of the different regions of one flexible display panel 2, the respective flexible wiring boards on which the terminal parts 7a, 7b, 7c, and 7f are provided are provided, through the lower side of FIG. 2, to the side opposite the display surface of the flexible display panel 2. For each of the surfaces 2d and 2e of the different regions of one flexible display panel 2, the respective flexible wiring boards on which the terminal parts 7d and 7e are provided are provided, through the upper side of FIG. 2, to the side opposite the display surface of the flexible display panel 2.

As described above, the flexible display panel 2 is configured so that the end parts 21 of the boundary parts (i.e., end parts of the folding parts at which the flexible display panel 2 is folded along the dotted lines in FIG. 2 to form right angles) are formed so as to each have a concave shape. This prevents stress from being concentrated on the end parts of the folding parts, so that it is possible to prevent the breakage of the flexible display panel 2.

In addition, according to the truncated hexahedron display device 1, all of the display surfaces of the truncated hexahedron display device 1 are formed by one flexible display panel 2. This (i) makes it less likely to cause gaps to occur at the seam parts and (ii) makes it unnecessary to use a plurality of flexible display panels 2 or to cause a plurality of flexible display panels 2 to overlap each other.

The above description discussed an example in which the surfaces 2a, 2b, 2c, 2d, 2e, and 2f of the different regions of the one flexible display panel 2 each include one gate driver, one source driver, and two terminal parts. However, the disclosure is not limited to this example. Alternatively, a plurality of gate drivers and/or a plurality of source drivers can be provided for each surface. It is possible that a single terminal part or three or more terminal parts are included.

The above description discussed an example in which the flexible display panel 2 is configured so that the terminal parts 6a, 6b, 6c, 6d, 6e, and 6f and the terminal parts 7a, 7b, 7c, 7d, 7e, and 7f are provided on the flexible wiring board (FPCB) parts connected to the flexible display panel 2. However, the disclosure is not limited to this example. Alternatively, the flexible wiring board can be a substrate made of a material identical to a material of which the flexible substrate used for the flexible display panel 2 is made. In such a case, the flexible substrate used for the flexible display panel 2 can be formed in advance so as to have a shape including the flexible wiring board parts.

Figure 3:
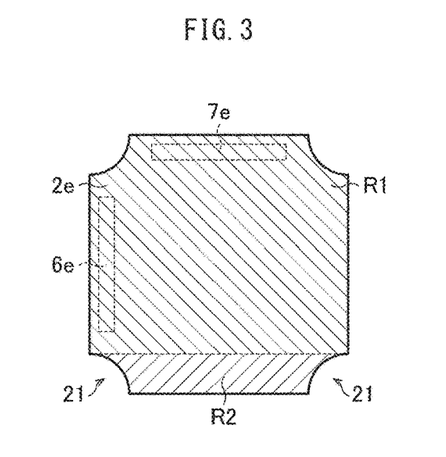
FIG. 3 is a view illustrating a surface of a flexible display panel, which surface has resolutions differing between (i) a boundary region in which end parts are formed so as to each have a concave shape and (ii) a region excluding the boundary region.

The FIG. 3 is a view illustrating the surface 2e of the flexible display panel 2 in a case where the surface 2e has resolutions differing between (i) a boundary part R2 formed by boring the end parts 21 of the boundary part between the surface 2e and the surface 2a connected to the surface 2e, so that the end parts 21 each have a concave shape and (ii) a region R1 which is a region other than boundary part R2.

FIG. 3 illustrates the surface 2e of the flexible display panel 2 illustrated in FIG. 2. However, the same applies to the other surfaces 2a, 2b, 2c, 2d, and 2f of the flexible display panel 2 (not illustrated).

As illustrated in FIG. 3, the surface 2e of the flexible display panel 2 is configured so that a horizontal width of the boundary part R2 in FIG. 3, which is formed by boring, in concave shapes, the end parts 21 of the boundary part between the surface 2e and the surface 2a connected to the surface 2e, is narrower than a horizontal width of the region R1 in FIG. 3 (which, from the viewpoint of design, excludes a region including both corner portions of an upper end part that are bored).

Therefore, in view of, for example, the density of the wiring and the density of the display pixels, in Embodiment 1, the resolution of the boundary part R2 in which the end parts 21 are formed so as to each have a concave shape is set lower than the resolution of the region R1.

Note that the term "resolution" means the number of the display pixels per row extending in the horizontal direction in FIG. 3 (or per column in the vertical direction in FIG. 3). In FIG. 3, the number of display pixels per row in the horizontal direction of the boundary part R2 in which the end parts 21 are formed so as to each have a concave shape is smaller than the number of display pixels per row in the horizontal direction of the region R1.

Note that in flexible display panel 2, the gate drivers and the source drivers (not illustrated) are provided, on the flexible wiring boards (FPCB), together with the terminal parts 6a, 6b, 6c, 6d, 6e, and 6f and terminal parts 7a, 7b, 7c, 7d, 7e, and 7f. However, the disclosure is not limited to this example. As described below, only gate drivers can be provided in the flexible display panel monolithically (gate driver monolithic (GDM)).

Figure 4:
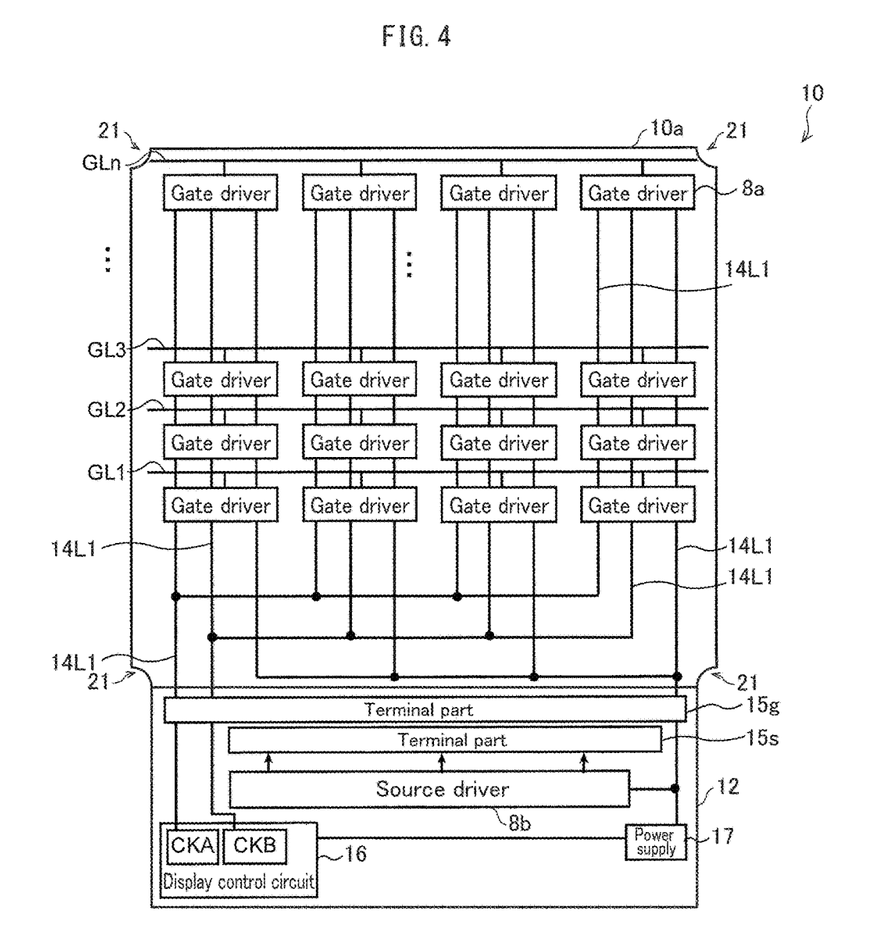
FIG. 4 is a view illustrating a case where (i) only gate drivers are provided monolithically (gate driver monolithic (GDM)) in the flexible display panel and (ii) the gate drivers are provided in a display region of the flexible display panel.

FIG. 4 is a view illustrating a case where only gate drivers 8a are provided monolithically (gate driver monolithic (GDM)) in the flexible display panel. Specifically, FIG. 4 is a view illustrating a case where the gate drivers 8a are provided in a display region of a flexible display panel 10.

As illustrated in FIG. 4, the flexible display panel 10 is configured so that the plurality of gate drivers 8a are provided monolithically (gate driver monolithic (GDM)) in (i) the display region of the flexible display panel 10 and (ii) a surface 10a (which is one of surfaces of different regions of one flexible display panel 10) corresponding to each of the six display surfaces of the truncated hexahedron display device 1.

As illustrated in FIG. 4, in the surface 10a (which is one of surfaces of the different regions of one flexible display panel 10), the following are provided: (i) gate lines GL1 . . . GLn, source lines (not illustrated), and (ii) the plurality of gate drivers 8a.

The plurality of gate drivers 8a, which are provided in the display region, supply, to the gate lines GL1 . . . GLn are formed in the display region, signals (scanning signal) for controlling a plurality of active elements (such as transistor elements or the like) (not illustrated) which are provided in the display region of the flexible display panel 10. The following are provided on the flexible wiring board (FPCB) 12 and are externally provided: (i) a source driver 8b for supplying image signals to the source lines, (ii) two terminal parts 15g and 15s, (iii) a display control circuit 16, and (ii) a power supply 17. From the display control circuit 16, control signals are supplied to the gate drivers 8a via wires 14L1.

The above description discussed an example in which the flexible display panel 10 includes two terminal parts 15g and 15s. However, the disclosure is not limited to this example. Alternatively, a single terminal part can be provided.

In addition, FIG. 4 illustrates only the surface 10a of the flexible display panel 10. In each of the other five surfaces of different regions of the flexible display panel 10, however, a plurality of gate drivers are likewise provided monolithically (gate driver monolithic (GDM)) in the display region. The source driver is provided on the flexible wiring board.

In the case of the flexible display panel 10 illustrated in FIG. 4, the flexible wiring board 12 can is a substrate made of a material identical to a material of which the flexible substrate used for the flexible display panel 10 is made. In a case where the flexible display panel 10 is folded between flexible wiring board 12 and the surface 10a, it is possible to provide the source drivers 8b and the terminal parts 15g and 15s on a surface opposite the display surface of the flexible display panel 10.

In the case of the flexible display panel 10 illustrated in FIG. 4, it is possible that at least one of the end parts of the boundary part (between the flexible wiring board 12 and the surface 10a, at which the flexible display panel 10 is folded) is formed so as to have a concave shape (not illustrated).

By thus forming the gate drivers 8a monolithically (gate driver monolithic) in the display region, it is possible to achieve a flexible display panel 10 having a narrow frame.

In order to form the gate drivers monolithically (gate driver monolithic (GDM)) in the flexible display panel, it is preferable to use, in a process of producing the flexible display panel, a flexible substrate having heat resistance to such an extent to withstand a temperature in a process of producing the gate drivers.

However, in a case where, for example, it is not possible to obtain a flexible substrate which has heat resistance sufficient to withstand the temperature in the process of producing the gate drivers, the flexible display panel can be produced by (i) forming gate drivers monolithically (gate driver monolithic (GDM)) on a film formed on a glass substrate which is a non-flexible substrate and is highly heat resistant, (ii) peeling only the glass substrate, and (iii) providing the flexible substrate.

The above description discussed an example in which the gate drivers are provided in each surface of the flexible display panel 10 illustrated in FIG. 4. However, the disclosure is not limited to this example. Alternatively, a gate driver can be shared between adjacent surfaces of the flexible display panel 10. In such a case, gate drivers can be distributed over a plurality of surfaces of the flexible display panel 10, between which the gate drivers are shared.

Embodiment 1 also discussed an example in which the source driver is provided on each surface of the flexible display panel. However, the disclosure is not limited to this example. Alternatively, source driver can be shared between adjacent surfaces of the flexible display panel. In such a case, source driver can be distributed over flexible wiring boards connected to a plurality of surfaces of the flexible display panel, between which the source driver is shared.

In the case of the flexible display panel 10 illustrated in FIG. 4, the gate drivers are distributed in the surfaces in the display region. However, the disclosure is not limited to this example. Alternatively, the gate drivers can be provided at the end parts of the surfaces in the display region.

Figure 5:
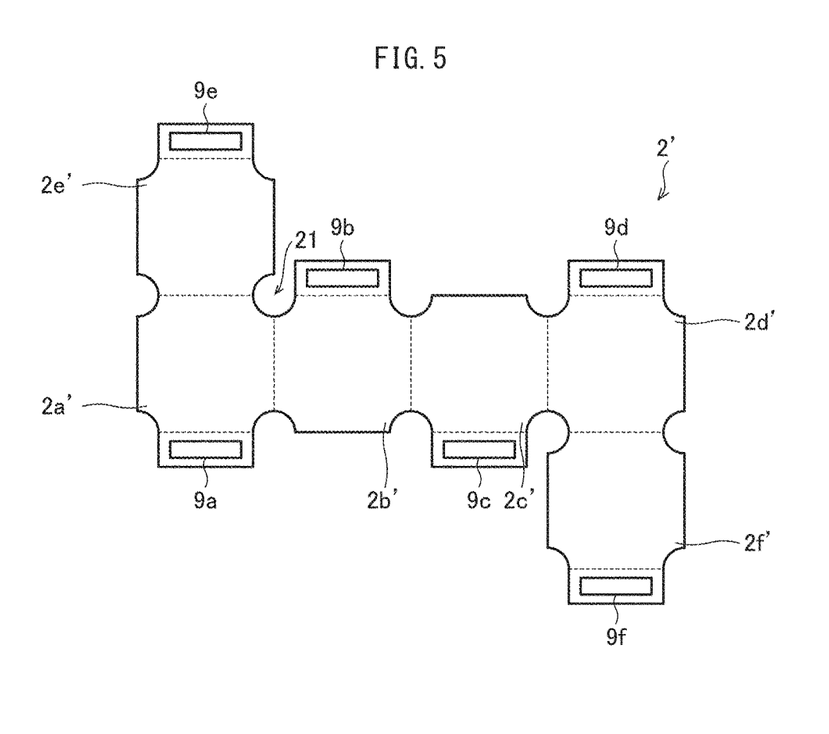
FIG. 5 is a view illustrating a case where one terminal part is provided in each of the surfaces of the flexible display panel.

FIG. 5 is a view schematically illustrating a configuration of a flexible display panel 2'. Specifically, FIG. 5 is a view illustrating a case where terminal parts 9a, 9b, 9c, 9d, 9e, and 9f are provided for respective surfaces 2a' 2b', 2c', 2d', 2e', and 2f of the flexible display panel 2'.

In the flexible display panel 2', the terminal parts 9a, 9b, 9c, 9d, 9e, and 9f are provided on a flexible substrate used for the flexible display panel 2'. That is, a flexible wiring board is substrate made of a material identical to a material of which the flexible substrate used for the flexible display panel 2' is made. This allows the flexible substrate, which is used for the flexible display panel 2', to be formed in advance so as to have a shape including the flexible wiring board parts.

The terminal parts 9a, 9b, 9c, 9d, 9e, and 9f are formed by extending wires from the gate lines or the source lines to one foldable end part of each of the surfaces 2a', 2b', 2c', 2d', 2e', and 2f of the flexible display panel 2' formed so as to have a shape including the flexible wiring board part.

The flexible display panel 2' illustrated in FIG. 5 is configured so that the terminal parts 9a, 9b, 9c, 9d, 9e, and 9f do not overlap each other in a case where the truncated hexahedron display device 1 is assembled. Therefore, in FIG. 5, (i) the surface 2a' includes the terminal part 9a at a lower part thereof, (ii) the surface 2b' includes the terminal part 9b at an upper part thereof, (iii) the surface 2c' include the terminal part 9c at a lower part thereof, (iv) the surface 2d' includes the terminal part 9d at an upper part thereof, (v) the surface 2e' includes the terminal part 9e at an upper part thereof, and (vi) the surface 2f include the terminal part 9f at a lower part thereof.

Note that the above-described arrangement of the terminal parts 9a, 9b, 9c, 9d, 9e, and 9f is an example in which the terminal parts 9a, 9b, 9c, 9d, 9e, and 9f are prevented from overlapping each other in a case where the truncated hexahedron display device 1 is assembled. However, the disclosure is not limited to this example.

It is unnecessary to electrically connect the source lines (not illustrated) to each other or electrically connect the gate lines (not illustrated) to each other, which are provided in each of the surfaces 2a', 2b', 2c', 2d', 2e', and 2f of the flexible display panel 2'. The wires of common electrodes can be electrically connected to each other.

The flexible display panel 2' is configured so that (i) the gate drivers are provided monolithically (gate driver monolithic (GDM)) (not illustrated) in the flexible display panel 2' and (ii) the source drivers are externally provided (not illustrated).

Figure 6:
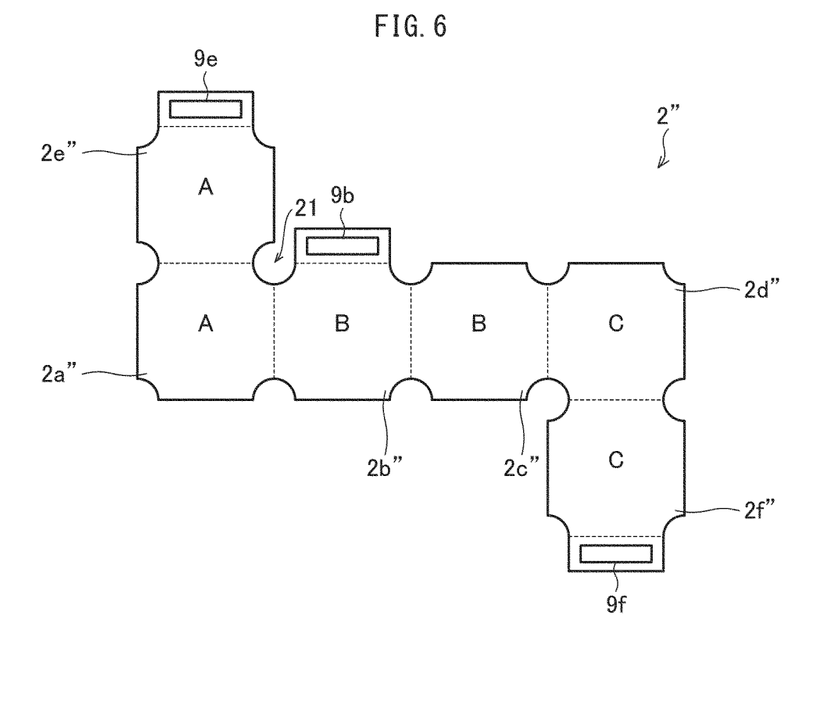
FIG. 6 is a view illustrating a case where one terminal part is provided for every two surfaces of the flexible display panel.

FIG. 6 is a view schematically illustrating a configuration of a flexible display panel 2". Specifically, FIG. 6 is a view illustrating a case where terminal parts 9b, 9e, and 9f are each provided for corresponding two surfaces of the flexible display panel 2".

In the flexible display panel 2", the terminal parts 9b, 9e, and 9f are provided on a flexible substrate used for the flexible display panel 2". That is, a flexible wiring board is substrate made of a material identical to a material of which the flexible substrate used for the flexible display panel 2" is made. This allows the flexible substrate, which is used for the flexible display panel 2", to be formed in advance so as to have a shape including the flexible wiring board parts.

The two surfaces 2a" and 2e" (first part) of the flexible display panel 2", which are two surfaces A in FIG. 6, include the terminal part 9e at an upper end part of the surface 2e" of the flexible display panel 2". The two surfaces 2a" and 2e" of the flexible display panel 2" share this terminal part 9e.

The two surfaces 2b" and 2c" of the flexible display panel 2", which are two surfaces B in FIG. 6, include the terminal part 9b at an upper end part of the surface 2b" of the flexible display panel 2". The two surfaces 2b" and 2c" of the flexible display panel 2" share this terminal part 9b.

The two surfaces 2d" and 2f" of the flexible display panel 2", which are two surfaces C in FIG. 6, include the terminal part 9f at a lower end part of the surface 2f" of the flexible display panel 2". The two surfaces 2d" and 2f" of the flexible display panel 2" share this terminal part 9f.

In regard to source lines (not illustrated) and gate lines (not illustrated) which are provided in each of the two surfaces 2a" and 2e" (two surfaces A) of the flexible display panel 2", (i) the source lines are electrically connected to each other and (ii) the gate lines are electrically connected to each other. In regard to source lines (not illustrated) and gate lines (not illustrated) which are provided in each of the two surfaces 2b" and 2c" (two surfaces B) of the flexible display panel 2", (i) the source lines are electrically connected to each other and (ii) the gate lines are electrically connected to each other. In regard to source lines (not illustrated) and gate lines (not illustrated) which are provided in each of the two surfaces 2d" and 2f" (two surfaces C) of the flexible display panel 2", (i) the source lines are electrically connected to each other and (ii) the gate lines are electrically connected to each other.

In regard to the source lines (not illustrated) and the gate lines (not illustrated) which are provided in each of the surfaces 2a" and 2b" (second part) which are a surface A and a surface B adjacent to each other in FIG. 6, (i) the source lines are not electrically connected to each other and (ii) the gate lines are not electrically connected to each other. In regard to the source lines (not illustrated) and the gate lines (not illustrated) which are provided in each of the surfaces 2c" and 2d" which are a surface B and a surface C adjacent to each other in FIG. 6, (i) the source lines are not electrically connected to each other and (ii) the gate lines are not electrically connected to each other.

The above description discussed an example in which the flexible display panel 2" illustrated in FIG. 6 includes each of the terminal parts 9b, 9e, and 9f for corresponding two surfaces which are adjacent to each other. However, the disclosure is not limited to this example. Alternatively, as illustrated in FIG. 2, it is possible to provide two terminal parts per surface of the flexible display panel 2". Alternatively, as illustrated in FIG. 5, it is possible to provide one terminal part per surface of the flexible display panel 2'.

The flexible display panel 2" illustrated in FIG. 6 is configured so that (i) the gate drivers are provided monolithically (gate driver monolithic (GDM)) (not illustrated) in the flexible display panel 2" and (ii) the source drivers are externally provided (not illustrated).

Assume a case where the flexible display panels 2, 2', 2", and 10 each have a touch panel function or a case where the durability of the hexahedron display device, for example, is taken into consideration. In this case, it is preferable that the flexible display panels 2, 2', 2", and 10 are each fixed to a framework or a support member described below, with use of an adhesive, an adhesive tape, a magnet, a screw, or the like.

Assume a case where the flexible display panels 2, 2', 2", and 10 are each fixed to a framework or a support member with use of a connecting member which allows for any of a fixed state and a non-fixed state. In this case, by causing the connecting member to change from the fixed state to the non-fixed state, it is possible to (i) separate the flexible display panels 2, 2', 2", and 10 each from the framework or the support member and (ii) change the shape of the hexahedron display device as necessary.

Figure 7:
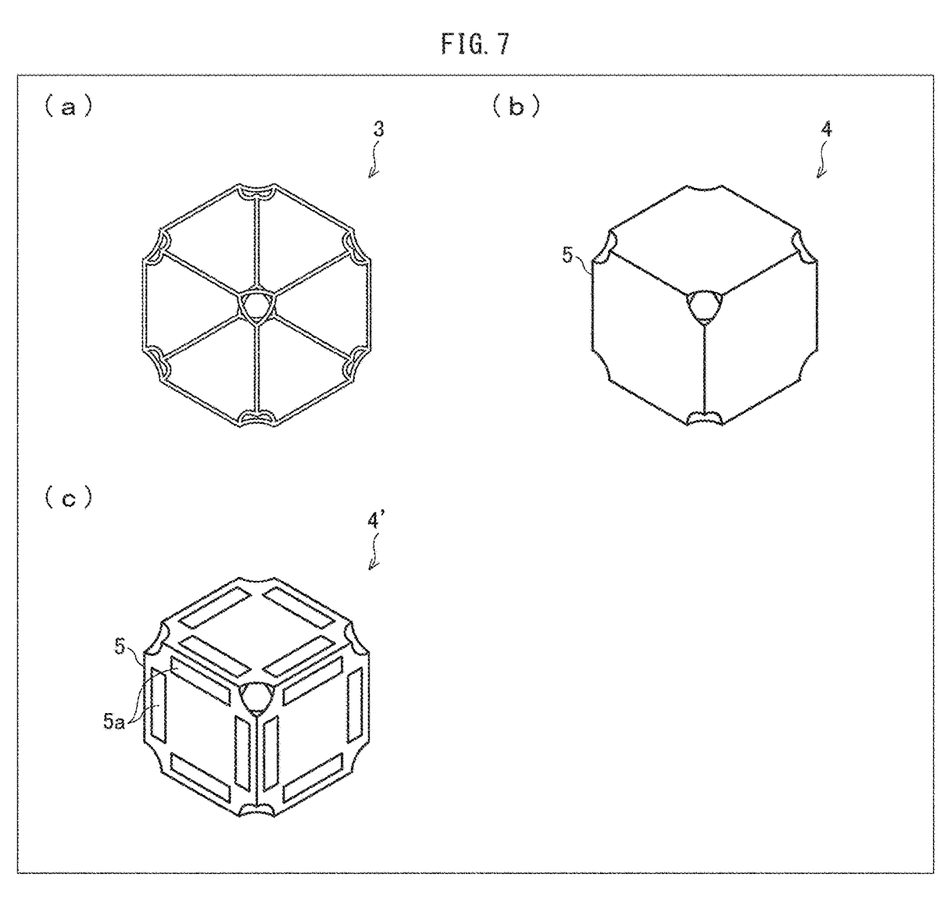
FIG. 7 is a set of views illustrating members for fixing the flexible display panel. (a) of FIG. 7 is a view illustrating a framework. (b) of FIG. 7 is a view illustrating a support member having a plurality of supporting surfaces. (c) of FIG. 7 is a view illustrating a support member having a plurality of supporting surfaces having openings.

FIG. 7 is a view illustrating members configured to fix each of the flexible display panels 2, 2', 2", and 10. (a) of FIG. 7 illustrates a framework 3. (b) of FIG. 7 illustrates a support member 4 having a plurality of supporting surfaces 5. (c) of FIG. 7 illustrates a support member 4' having a plurality of supporting surfaces 5 in each of which openings 5a are made.

In Embodiment 1, the flexible display panels 2, 2', 2", and 10 are used. Therefore, from the viewpoint of design, the corners of the framework 3 and the support members 4 and 4' are bored. However, it is unnecessary to bore the corners of the framework or support members.

As illustrated in (a) of FIG. 7, the framework 3 includes six supporting parts which are formed only by an outer frame corresponding to six display surfaces of the truncated hexahedron display device 1. The durability of the truncated hexahedron display device 1 is improved by fixing the flexible display panels 2, 2', 2", and 10 each to the framework 3 with use of an adhesive, an adhesive tape, a magnet, a screw, or the like.

As illustrated in (b) of FIG. 7, the support member 4 has six supporting surfaces 5 corresponding to the six display surfaces of truncated hexahedron display device 1, respectively. In a case where the flexible display panels 2, 2', 2", and 10 are each fixed to the six supporting surface 5 of the support member 4 with use of an adhesive, an adhesive tape, a magnet, a screw, or the like, the durability of the truncated hexahedron display device 1 is improved. In addition, touching accuracy and touching feeling can be improved in a case where (i) the flexible display panels 2, 2', 2", and 10 are each fixed to the six supporting surface 5 of the support member 4 with use of an adhesive, an adhesive tape, a magnet, a screw, or the like and (ii) the flexible display panels 2, 2', 2", and 10 each have a touch panel functionality.

As illustrated in (c) of FIG. 7, the support member 4' has six supporting surfaces 5 which (i) correspond to the six display surfaces of truncated hexahedron display device 1, respectively and (ii) have the openings 5a. The gate drivers, the source drivers, and the like of each of the flexible display panels 2, 2', 2", and 10 can be stored via the openings 5a of the supporting surfaces 5. Alternatively, the supporting surfaces 5 can have recesses instead of the openings 5a, provided that the gate drivers, the source drivers, and the like of each of the flexible display panels 2, 2', 2", and 10 can be stored. In a case where the flexible display panels 2, 2', 2", and 10 are each fixed to the six supporting surface 5 of the support member 4' with use of an adhesive, an adhesive tape, a magnet, a screw, or the like, the durability of the truncated hexahedron display device 1 is improved. In addition, touching accuracy and touching feeling can be improved in a case where (i) the flexible display panels 2, 2', 2", and 10 are each fixed to the six supporting surface 5 of the support member 4' with use of an adhesive, an adhesive tape, a magnet, a screw, or the like and (ii) the flexible display panels 2, 2', 2", and 10 each have a touch panel functionality.

Embodiment 1 discussed, as an example of a polyhedron display device having a plurality of display surfaces, an example of the truncated hexahedron display device 1 having six display surfaces. However, the disclosure is not limited to this example. Alternatively, as described below, various polyhedron display devices can be achieved with use of flexible display panels having various shapes.

Figure 8:
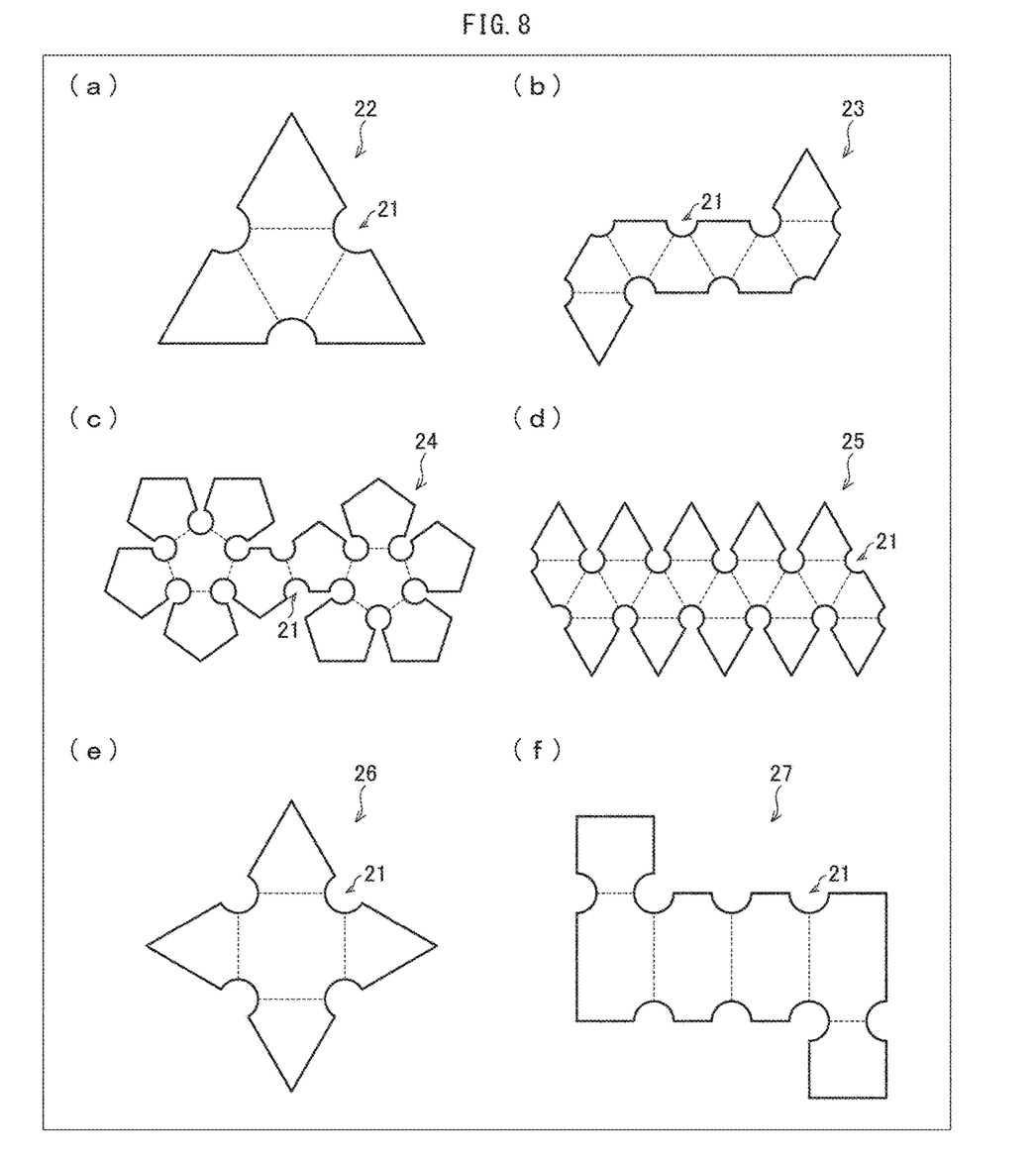
FIG. 8 is a view showing another example of a flexible display panel.

FIG. 8 is a view showing another example of a flexible display panel.

(a) of FIG. 8 illustrates a flexible display panel 22 used in production of a tetrahedron display device. (b) of FIG. 8 illustrates a flexible display panel 23 used in production of an octahedron display device. (c) of FIG. 8 illustrates a flexible display panel 24 used in production of a dodecahedron display device. (d) of FIG. 8 illustrates the flexible display panel 25 used in production of an icosahedron display device. (e) of FIG. 8 illustrates a flexible display panel 26 used in production of a quadrangular pyramid display device. (f) of FIG. 8 illustrates a flexible display panel 27 used in production of a quadratic prism display device.

In a case of any of the flexible display panels 22, 23, 24, 25, 26, and 27 illustrated in (a) through (f) of FIG. 8, at least end parts 21 of folding parts extending along the dotted lines (i.e., the end parts 21 of the boundary parts) are formed so as to each have a concave shape.

In the case of any of the flexible display panels 22, 23, 24, 25, and 26 illustrated in (a) through (e) of FIG. 8, the surfaces of different regions have shapes other than rectangular shapes, i.e., triangular shapes and pentagonal shapes. In the case of each of the triangular display surfaces, the pentagonal display surfaces, and the like of the polyhedron display devices including the display surfaces having shapes other than the rectangular shapes such as the triangular shapes, the pentagonal shapes, and the like, it is possible to display an image or the like on a rectangular display region located at a center part. On a region outside the rectangular display region, it is possible to display an image or the like such as a background color.

Embodiment 1 discussed examples in which the following are used: (i) a flexible display panel to be used in production of a polyhedron display device (see FIGS. 2, 4, 5, and 6 and (a), (b), (c), and (d) of FIG. 8), (ii) a flexible display panel to be used in production of a pyramid display device (see (e) of FIG. 8), and (iii) a flexible display panel to be used in production of a prism display device (see (f) of FIG. 8). However, the disclosure is not limited to this example. The prism display device is not limited to a right prism display device as illustrated in (f) of FIG. 8, but can be an oblique prism display device. In addition, FIG. 8 shows examples in which part of vertices of the flexible display panels is cut off.

However, the disclosure is not limited to this example. Alternatively, it is possible to cut off all of the vertices in view of design.

Embodiment 2

Figure 9:
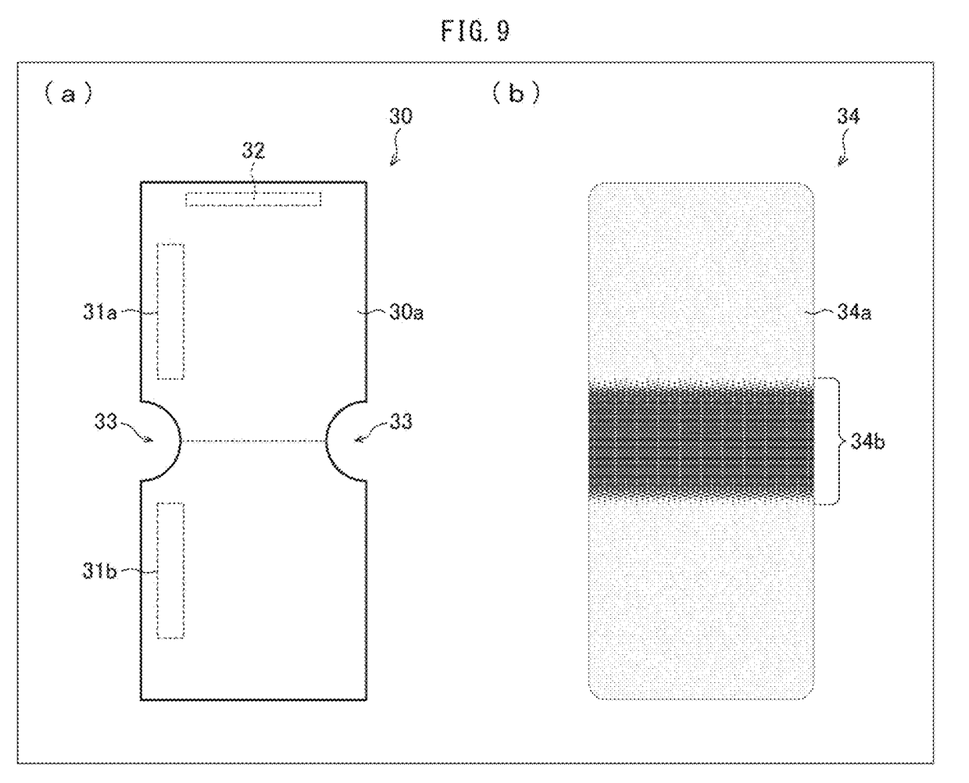

The following description will discuss Embodiment 2 of the disclosure with reference to FIG. 9. Embodiment 2 differs from Embodiment 1 in that a flexible display panel 30 is constituted by a surface 30a in which end parts 33 of a folding part are formed so as to each have a concave shape. The other configurations are as described in Embodiment 1. For convenience, members having functions identical to those illustrated in the drawings of Embodiment 1 are given identical reference signs, and their descriptions are omitted.

(a) of FIG. 9 is a view illustrating the flexible display panel 30 constituted by a surface in which the end parts 33 of the folding part are formed so as to each have a concave shape. (b) of FIG. 9 is a view illustrating a foldable support member.

As illustrated in (a) of FIG. 9, the flexible display panel 30 is constituted by the surface 30a in which the end parts 33 of the folding part (at which the flexible display panel 30 is to be folded along the dotted line) are formed so as to each have a concave shape.

Embodiment 2 discussed an example in which the end parts 33 of the folding part are both bored. However, the disclosure is not limited to this example. Alternatively, it is possible that only one of the end parts 33 of the folding part is bored.

In Embodiment 2, (i) terminal parts 31a, 31b, and 32 are provided on respective flexible wiring boards, (ii) gate drivers (not illustrated) are provided monolithically (gate driver monolithic (GDM)) in the flexible display panel, and (iii) source drivers (not illustrated) are externally provided. However, the disclosure is not limited to this example.

(b) of FIG. 9 is a view illustrating a living hinge 34 which is an example of the foldable support member.

The living hinge 34 is a single substrate. A folding part 34b of the substrate is a part where a plurality of holes are made. In Embodiment 2, the size of each of the holes is 0.4 mm (short side)×10 mm (long side)×0.4 mm (depth). However, the disclosure is not limited to this example. The size of each of the holes is not particularly limited, provided that (i) the substrate can be folded and (ii) a durability at a certain level or more can be secured.

In Embodiment 2, the substrate is a stainless steel substrate having a thickness of 0.4 mm. This causes the plurality of holes to penetrate through the substrate.

Embodiment 2 discussed an example in which the substrate is a stainless steel substrate. However, the disclosure is not limited to this example. For example, the substrate can be a resin substrate such as one made of a polyimide resin.

The flexible display device was achieved by (i) arranging the folding part (the dotted line part in (a) of FIG. 9) of the flexible display panel 30 illustrated in (a) of FIG. 9 so that the folding part overlaps, in a plan view, the folding part 34b of the substrate illustrated in (b) of FIG. 9 and then (ii) combining the flexible display panel 30 to the living hinge 34. Note that the living hinge 34 illustrated in (b) of FIG. 9 is located on side opposite a side with which the flexible display panel 30 is combined. The living hinge 34 has an outer surface 34a which is a surface exposed to the outside.

In the flexible display panel 30, the end parts 33 of the folding part are formed so as to each have a concave shape. Therefore, a width of a folding part where each of the end parts 33 is formed so as to have a concave shape is narrower than a width of remaining parts of the flexible display panel 30, which remaining parts exclude the folding part.

Therefore, in Embodiment 2, in view of, for example, the density of the wiring and the density of the display pixels, a resolution of the folding part of the flexible display panel 30 where each of the end parts 33 is formed so as to have a concave shape is set lower than a resolution of remaining parts of the flexible display panel 30, which remaining parts exclude the folding part.

Embodiment 3

Figure 10:
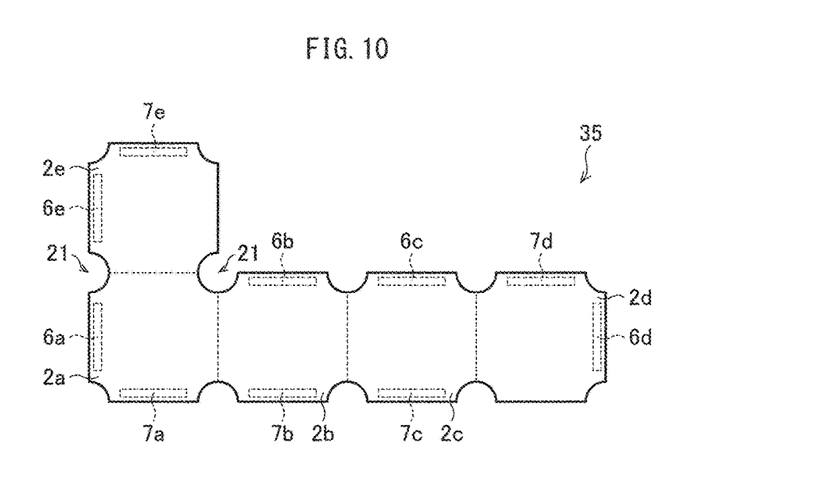
FIG. 10 is a view illustrating a flexible display panel constituting five display surfaces of a display device having one side that is open.

The following description will discuss Embodiment 3 of the disclosure with reference to FIG. 10. Embodiment 3 differs from Embodiment 1 and 2 in that a flexible display panel 35 is to be used for production of a display device having (i) five display surfaces and (ii) one side that is open. The other configurations are as described in Embodiments 1 and 2. For convenience, members having functions identical to those illustrated in the drawings of Embodiments 1 and 2 are given identical reference signs, and their descriptions are omitted.

FIG. 10 is a view illustrating the flexible display panel 35 to be used for production of a display device having (i) five display surfaces and (ii) one side that is open.

The five display surfaces of the display device (having one side open) respectively correspond to the surfaces 2a, 2b, 2c, 2d and 2e of the different regions of one flexible display panel 35.

End parts 21 of a boundary part between a surface 2*e* and a surface 2*a* connected to the surface 2*e* are formed so as to each have a concave shape. Likewise, end parts 21 of a boundary part between the surface 2*a* and a surface 2*b* connected to the surface 2*a* are formed so as to each have a concave shape. Likewise, end parts 21 of a boundary part between the surface 2*b* and a surface 2*c* connected to the surface 2*b* are formed so as to each have a concave shape. Likewise, end parts 21 of a boundary part between the surface 2*c* and a surface 2*d* connected to the surface 2*c* are formed so as to each have a concave shape.

Embodiment 3 achieves, with use of the flexible display panel 35, a display device having (i) five display surfaces and (ii) one side that is open. However, the disclosure is not limited to this example. For example, it is possible to achieve, with use of a flexible display panel having a different shape, a display device having two or more surfaces which are open.

Recap

A display device in accordance with Aspect 1 of the disclosure is a display device including: a flexible display having at least one part at which the flexible display is folded, at least one of end parts of the at least one part of the flexible display is formed so as to have a concave shape.

According to the configuration, at least one of end parts of the folding part of the flexible display is formed so as to have a concave shape. It is therefore possible to prevent stress from being concentrated on the end parts of the folding part. This achieves a display device which is highly durable to withstand even folding at one or more positions.

A display device in accordance with Aspect 2 of the disclosure can be configured in Aspect 1 so as to further include a plurality of display surfaces, the plurality of display surfaces being different surfaces of respective regions of the flexible display, and the flexible display being configured to be folded between the different surfaces which are connected to each other.

With the configuration, it is possible to achieve a display device which includes a plurality of display surfaces and which is highly durable to withstand even folding at one or more positions.

A display device in accordance with Aspect 3 of the disclosure is preferably configured in Aspect 1 so that: the flexible display has a rectangular shape; and the flexible display has (i) a first region in which the at least one of the end parts is formed so as to have a concave shape and (ii) a second region excluding the first region, the first region having a resolution lower than that of the second region.

According to the configuration, the flexible display has (i) a first region in which the at least one of the end parts is formed so as to have a concave shape and (ii) a second region excluding the first region, the first region having a resolution lower than that of the second region. This is advantageous in a case of designing, for example, (i) an arrangement of the wiring of the flexible display and (ii) an arrangement of display pixels.

A display device in accordance with Aspect 4 of the disclosure is preferably configured in Aspect 2 so that: each of the different surfaces of the respective regions of the flexible display has a rectangular shape; and the each of the different surfaces of the respective regions of the flexible display has (i) a first region in which the at least one of the end parts is formed so as to have a concave shape and (ii) a second region excluding the first region, the first region having a resolution lower than that of the second region.

According to the configuration, the flexible display has (i) a first region in which the at least one of the end parts is formed so as to have a concave shape and (ii) a second region excluding the first region, the first region having a resolution lower than that of the second region. This is advantageous in a case of designing, for example, (i) an arrangement of the wiring of the flexible display and (ii) an arrangement of display pixels.

A display device in accordance with Aspect 5 of the disclosure can be configured in Aspect 2 or 4 so that the flexible display is fixed in a shape in which the flexible display is folded between the different surfaces which are connected to each other.

With the configuration, it is possible to achieve a display device having a plurality of display surfaces which are fixed while one flexible display is folded.

A display device in accordance with Aspect 6 of the disclosure can be configured in Aspect 2 or 4 so that the flexible display is fixed in a shape in which the flexible display is folded between the different surfaces which are connected to each other, the flexible display being fixed by a connecting member which allows for any of a fixed state and a non-fixed state.

According to the configuration, the flexible display is folded, and, in such a state, is fixed by the connecting member which allows for any of the fixed state and the non-fixed state. Therefore, by causing the connecting member to change from the fixed state to the non-fixed state, it is possible to change the shape of the display device having the plurality of display surfaces.

A display device in accordance with Aspect 7 of the disclosure can be configured in any one of Aspects 1 through 6 so that the flexible display is fixed to a support member having a supporting surface.

With the configuration, it is possible to improve the durability of the display device. In addition, touching accuracy and touching feeling can be improved in a case where the flexible display has a touch panel functionality.

A display device in accordance with Aspect 8 of the disclosure can be configured in any one of Aspects 1 through 6 so that the flexible display is fixed, by a connecting member which allows for any of a fixed state and a non-fixed state, to a support member having a supporting surface.

According to the configuration, the flexible display is fixed, to the support member, by the connecting member which allows for any of the fixed state and the non-fixed state. Therefore, by causing the connecting member to change from the fixed state to the non-fixed state, it is possible to (i) separate the display device from the support member and (ii) change the shape of the display device.

A display device in accordance with Aspect 9 of the disclosure can be configured in Aspect 7 or 8 so that the supporting surface has an opening or a recess.

With the configuration, it is possible to store a drive circuit and the like of the flexible display via the opening or the recess of the supporting surface.

A display device in accordance with Aspect 10 of the disclosure can be configured in Aspect 2 or 4 so that the flexible display is fixed to a framework including a plurality of supporting parts which are formed only by an outer frame corresponding to the plurality of display surfaces.

With the configuration, it is possible to improve the durability of the display device.

A display device in accordance with Aspect 11 of the disclosure can be configured in Aspect 2 or 4 so that the flexible display is fixed, by a connecting member which allows for any of a fixed state and a non-fixed state, to a framework including a plurality of supporting parts which are formed only by an outer frame corresponding to the plurality of display surfaces.

According to the configuration, the flexible display is fixed, to the framework, by the connecting member which allows for any of the fixed state and the non-fixed state. Therefore, by causing the connecting member to change from the fixed state to the non-fixed state, it is possible to (i) separate the display device from the framework and (ii) change the shape of the display device.

A display device in accordance with Aspect 12 of the disclosure can be configured in any one of Aspects 1 through 11 so that: the flexible display includes a gate driving circuit and/or a source driving circuit which is/are provided to a flexible wiring board connected to the flexible display; and the flexible wiring board is made of a material identical to a material for a flexible substrate included in the flexible display.

According to the configuration, the flexible wiring board is made of a material identical to a material for a flexible substrate included in the flexible display. Therefore, in a case where the shape of the flexible substrate included in the flexible display is to be determined, it is possible to cause, in advance, the shape to include the flexible wiring board part.

A display device in accordance with Aspect 13 of the disclosure can be configured in any one of Aspects 1 through 11 so that the flexible display includes a gate driving circuit provided in a display region of the flexible display.

With the configuration, it is possible to achieve a display device in which the gate driving circuit is provided in the display region of the flexible display.

A display device in accordance with Aspect 14 of the disclosure can be configured in Aspect 13 so that the gate driving circuit is provided in the vicinity of an end part of the flexible display.

With the configuration, it is possible to achieve a display device in which the gate driving circuit is provided in the vicinity of the end part of the flexible display.

A display device in accordance with Aspect 15 of the disclosure can be configured in Aspect 13 so that the gate driving circuit is distributed in the display region of the flexible display.

With the configuration, it is possible to achieve a display device in which the gate driving circuit is distributed in the display region of the flexible display.

A display device in accordance with Aspect 16 of the disclosure can be configured in any one of Aspects 1 through 15 so that the flexible display includes a plurality of terminal parts which are provided outside a display region of the flexible display such that the plurality of terminal parts do not overlap each other in a case where the flexible display is folded and fixed.

According to the configuration, the plurality of terminal parts do not overlap each other in a case where the flexible display is folded and fixed.

A display device in accordance with Aspect 17 of the disclosure can be configured in any one of Aspects 2, 4, 5, 6, 10, and 11 so that: the flexible display includes a plurality of terminal parts which are provided outside a display region of the flexible display; the different surfaces of the respective regions of the flexible display include a first part which is made up of two connected surfaces of the different surfaces and in which one of the plurality of terminal parts is a common terminal part, the first part being configured so that a wire of one of the two connected surfaces and a wire of the other of the two connected surfaces are electrically connected to each other; and the different surfaces of the respective regions of the flexible display include a second part which is made up of two connected surfaces of the different surfaces and in which the two connected surfaces include respective terminal parts out of the plurality of terminal parts, the second part being configured so that a wire of one of the two connected surfaces and a wire of the other of the two connected surfaces are not electrically connected to each other.

With the configuration, it is possible to achieve a display device in which the number of terminal parts is reduced.

A display device in accordance with Aspect 18 of the disclosure can be configured in any one of Aspects 1 through 17 so that the flexible display is a flexible organic EL panel.

With the configuration, it is possible to achieve a display device including the flexible organic EL panel.

Additional Remarks

The disclosure is not limited to the embodiments, but can be altered by a skilled person in the art within the scope of the claims. The disclosure also encompasses, in its technical scope, any embodiment derived by combining technical means disclosed in differing embodiments. Further, it is possible to form a new technical feature by combining the technical means disclosed in the respective embodiments.

INDUSTRIAL APPLICABILITY

The disclosure can be used for display devices.

REFERENCE SIGNS LIST

1 Truncated hexahedron display device (display device)
2 Flexible display panel (flexible display)
2' Flexible display panel (flexible display)
2" Flexible display panel (flexible display)
2a through 2f Surfaces of flexible display panel (surfaces of different regions of flexible display)
2a' through 2f' Surfaces of flexible display panel (surfaces of different regions of flexible display)
2a" through 2f" Surfaces of flexible display panel
3 Framework
4 Support member
4' Support member
5 Supporting surface
5a Opening (opening or recess)
6a through 6f Terminal parts
7a through 7f Terminal parts
8a Gate driver (gate driving circuit)
8b Source driver (source driving circuit)
9a through 9f Terminal parts
10 Flexible display panel (flexible display)
12 Flexible wiring board
15s Terminal part
15g Terminal part
21 End parts of folding part (end parts of boundary part)
22 Flexible display panel (flexible display)
23 Flexible display panel (flexible display)
24 Flexible display panel (flexible display)
25 Flexible display panel (flexible display)
26 Flexible display panel (flexible display)
27 Flexible display panel (flexible display)
30 Flexible display panel (flexible display)
30a Surface of flexible display panel
31a Terminal part
31b Terminal part 32 Terminal part
33 End parts of folding part (end parts of boundary part)
34 Living hinge (foldable support member/support member)
35 Flexible display panel (flexible display)
R1 Region (second region) other than boundary part R2
R2 Boundary part (first region) formed so as to have concave shapes

The invention claimed is:

1. A display device comprising:
a flexible display having at least one part at which the flexible display is folded,
at least one of end parts of the at least one part of the flexible display is formed so as to have a concave shape, wherein
the flexible display has a rectangular shape; and
the flexible display includes (i) a first region in which the at least one of the end parts has a concave shape and (ii) a second region excluding the first region, the first region having a resolution lower than that of the second region.

2. The display device according to claim 1, further comprising:
a plurality of display surfaces,
the plurality of display surfaces being different surfaces of respective regions of the flexible display, and
the flexible display being configured to be folded between the different surfaces which are connected to each other.

3. The display device according to claim 1, wherein
the flexible display is fixed to a support member having a supporting surface.

4. The display device according to claim 1, wherein
the flexible display is fixed, by a connecting member which allows for any of a fixed state and a non-fixed state, to a support member having a supporting surface.

5. The display device according to claim 1, wherein:
the flexible display includes a gate driving circuit and/or a source driving circuit which is/are provided to a flexible wiring board connected to the flexible display; and
the flexible wiring board is made of a material identical to a material for a flexible substrate included in the flexible display.

6. The display device according to claim 1, wherein
the flexible display includes a gate driving circuit provided in a display region of the flexible display.

7. The display device according to claim 1, wherein
the flexible display includes a plurality of terminal parts which are provided outside a display region of the flexible display such that the plurality of terminal parts do not overlap each other in a case where the flexible display is folded and fixed.

8. The display device according to claim 1, wherein
the flexible display is a flexible organic EL panel.

9. A display device comprising:
a flexible display having at least one part at which the flexible display is folded,
at least one of end parts of the at least one part of the flexible display has a concave shape, wherein
the flexible display is fixed, by a connecting member which allows for any of a fixed state and a non-fixed state, to a support member having a supporting surface.

10. The display device according to claim 9, further comprising:
a plurality of display surfaces,
the plurality of display surfaces being different surfaces of respective regions of the flexible display, and
the flexible display being configured to be folded between the different surfaces which are connected to each other.

11. The display device according to claim 10, wherein:
each of the different surfaces of the respective regions of the flexible display has a rectangular shape; and
the each of the different surfaces of the respective regions of the flexible display includes (i) a first region in which the at least one of the end parts has a concave shape and (ii) a second region excluding the first region, the first region having a resolution lower than that of the second region.

12. The display device according to claim 10, wherein
the flexible display is fixed in a shape in which the flexible display is folded between the different surfaces which are connected to each other.

13. The display device according to claim 10, wherein
the flexible display is fixed in a shape in which the flexible display is folded between the different surfaces which are connected to each other, the flexible display being fixed by the connecting member.

14. The display device according to claim 10, wherein
the flexible display is fixed to a framework including a plurality of supporting parts which are defined only by an outer frame corresponding to the plurality of display surfaces.

15. The display device according to claim 10, wherein
the flexible display is fixed by the connecting member to a framework including a plurality of supporting parts which are formed only by an outer frame corresponding to the plurality of display surfaces.

16. The display device according to claim 9, wherein
the supporting surface has an opening or a recess.

17. The display device according to claim 9, wherein:
the flexible display includes a gate driving circuit and/or a source driving circuit which is/are provided to a flexible wiring board connected to the flexible display; and
the flexible wiring board is made of a material identical to a material for a flexible substrate included in the flexible display.

18. A display device comprising:
a flexible display having at least one part at which the flexible display is folded,
at least one of end parts of the at least one part of the flexible display is formed so as to have a concave shape, wherein
the flexible display includes a plurality of terminal parts which are provided outside a display region of the flexible display such that the plurality of terminal parts do not overlap each other in a case where the flexible display is folded and fixed.

* * * * *